United States Patent
Wang

(10) Patent No.: US 8,279,693 B2
(45) Date of Patent: Oct. 2, 2012

(54) PROGRAMMABLE TRACKING CIRCUIT FOR TRACKING SEMICONDUCTOR MEMORY READ CURRENT

(75) Inventor: Zhongze Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 238 days.

(21) Appl. No.: 12/757,485

(22) Filed: Apr. 9, 2010

(65) Prior Publication Data

US 2011/0249524 A1 Oct. 13, 2011

(51) Int. Cl.
*G11C 7/00* (2006.01)

(52) U.S. Cl. .......................... 365/205; 365/226; 365/156

(58) Field of Classification Search .................. 365/205, 365/226, 156, 203, 194, 210, 230.06, 158, 365/209, 154, 189.06, 189.11, 211, 148, 365/189.09

See application file for complete search history.

(56) References Cited

U.S. PATENT DOCUMENTS

| | | | |
|---|---|---|---|
| 6,473,356 B1 | 10/2002 | Raszka | |
| 6,731,534 B1 | 5/2004 | Fan | |
| 7,215,587 B2 | 5/2007 | Lee et al. | |
| 7,376,032 B2 | 5/2008 | Nguyen et al. | |
| 2004/0027852 A1 | 2/2004 | Watanabe et al. | |
| 2005/0169051 A1* | 8/2005 | Khalid et al. | 365/185.03 |
| 2007/0002617 A1 | 1/2007 | Houston et al. | |
| 2009/0231934 A1 | 9/2009 | Jung et al. | |
| 2011/0085399 A1* | 4/2011 | Chen et al. | 365/226 |
| 2011/0141816 A1* | 6/2011 | Guterman et al. | 365/185.18 |
| 2011/0193609 A1* | 8/2011 | Lin et al. | 327/333 |

OTHER PUBLICATIONS

International Search Report and Written Opinion—PCT/US2011/031251, ISA/EPO—Jul. 12, 2011.

* cited by examiner

*Primary Examiner* — Dang Nguyen

(74) *Attorney, Agent, or Firm* — Sam Talpalatsky; Nicholas J. Pauley; Jonathan T. Velasco

(57) ABSTRACT

One example memory device includes a memory array, a sense amplifier, and a tracking circuit. The memory array is formed of a plurality of memory cells. The sense amplifier is for accessing the memory array. The tracking circuit is for tracking memory read current of the memory array. The tracking circuit comprises one or more columns of tracking cells. Each column is coupled to a corresponding bit line to provide a drive current on the bit line for triggering a memory read operation by the sense amplifier. At least one of the columns comprises two tracking cells connected in series to each other.

24 Claims, 11 Drawing Sheets

PROGRAMMABLE TRACKING CIRCUIT FOR TRACKING SEMICONDUCTOR MEMORY READ CURRENT

FIELD OF DISCLOSURE

The present disclosure is directed to semiconductor memories, and more particularly, to a programmable tracking circuit for tracking semiconductor memory read current.

BACKGROUND

Semiconductor memories, especially high-density semiconductor memories such as Static Random Access Memory (SRAM) utilizing small device geometries, generally incorporate sense amplifiers to provide the output drive capability for memory reads. Each sense amplifier detects the differential voltage across a corresponding pair of complementary bit lines (BL and BL') in an SRAM array. Outputting correctly sensed bit data from the memory array is important for data integrity, access speed, power consumption, etc., and depends on a number of process-related and environmental variables.

FIG. 1 illustrates a portion of an example memory device 100. Memory device 100 includes one or more memory arrays 102 (only one of which is shown). Each memory array 102 includes a plurality of memory cells 104 arranged in a plurality of rows and a plurality of columns, each row corresponding to a word line WL (WL0, WL1, ...) and each column corresponding to a pair of complementary bit lines, BL and BL' ((BL0, BL'0), (BL1, BL'1), (BL2, BL'2), etc.). A word line decoder 106 receives word line address signals ("WL ADDR") and provides word line signals to select one of word lines WL of memory array 102. A bit line decoder 108 receives bit line address signals ("BL ADDR") and provides bit line signals Y (Y0, Y1, Y2, etc.) to select a pair of bit lines BL and BL' of memory array 102 through switches 110. Each switch 110 may comprise a pair of NMOS transistors, for example, and is turned on and off by bit line signals Y. Each memory cell 104 may be selected by selecting the corresponding word line and pair of bit lines. A sense amplifier 112 is coupled to bit lines BL and BL' to detect the bit stored in the selected memory cell 104 and to output the same. A control signal CTRL is provided to word line decoder 106 and the sense amplifier 112 as a clock signal to trigger their respective operations. For example, on an edge (rising edge or falling edge) of control signal CTRL, word line decoder 106 may decode the word line address and the sense amplifier 112 may detect a bit stored in a selected memory cell 104 and output the same. Memory device 100 also includes a plurality of precharging PMOS transistors 114 each coupling a corresponding bit line BL or BL' to a power supply voltage VDD to precharge the corresponding bit line BL or BL', thereby increasing the speed in accessing memory cells 104.

Memory cells 104 may comprise any suitable structure, such as a conventional 6-transistor structure shown in FIG. 2. FIG. 2 shows one memory cell 104 including two PMOS transistors 202 and 204 and four NMOS transistors 206, 208, 210, and 212. Each of the MOS transistors 202, 204, 206, 208, 210, and 212 has a gate, a source, and a drain. The gate of PMOS transistor 202, the gate of NMOS transistor 206, the drain of PMOS transistor 204, the drain of NMOS transistor 208, and the source of NMOS transistor 212 are all coupled to one another. The gate of PMOS transistor 204, the gate of NMOS transistor 208, the drain of PMOS transistor 202, the drain of NMOS transistor 206, and the source of NMOS transistor 210 are also all coupled to one another. The sources of PMOS transistors 202 and 204 are coupled to the power supply voltage VDD. The sources NMOS transistors 206 and 208 are grounded to VSS. The gates of NMOS transistors 210 and 212 are coupled to receive the word line signal WL. The drain of NMOS transistor 210 is coupled to the bit line BL. The drain of NMOS transistor 212 is coupled to the bit line BL'. Thus, PMOS transistor 202 and NMOS transistor 206 form an inverter 214, and PMOS transistor 204 and NMOS transistor 208 form an inverter 216. Inverters 214 and 216 are coupled to form a loop and may stably store a bit or other unit of data. If the drains of PMOS transistor 202 and NMOS transistor 206 are at a logic high, i.e., approximately VDD, then the drains of PMOS transistor 204 and NMOS transistor 208 are at a logic low, i.e., approximately VSS, and memory cell 104 is considered to have stored a logic high bit. If the drains of PMOS transistor 202 and NMOS transistor 206 are at logic low, then the drains of PMOS transistor 204 and NMOS transistor 208 are at logic high, and memory cell 104 is considered to have stored a logic low bit. When NMOS transistors 210 and 212 are turned on by word line signal WL, the bit stored in memory cell 104 and its reverse respectively appear on corresponding bit lines BL and BL'.

FIG. 2 also shows two of precharging PMOS transistors 114, shown as 114a and 114b, each having a gate, a drain, and a source. The gates of precharging PMOS transistors 114a and 114b are coupled to receive control signal CTRL. The sources of precharging PMOS transistors 114a and 114b are coupled to power supply voltage VDD. The drain of precharging PMOS transistor 114a is coupled to bit line BL. The drain of precharging PMOS transistor 114b is coupled to bit line BL'. Switch 110 is shown to include NMOS transistors 218 and 220, each having a gate, a drain, and a source. The gates of NMOS transistors 218 and 220 receive bit line signal Y from the bit line decoder 108 (not shown). The drain of NMOS transistor 218 is coupled to bit line BL. The drain of NMOS transistor 220 is coupled to bit line BL'. The sense amplifier 112 is coupled to the sources of NMOS transistors 218 and 220. Thus, when one memory cell 104 is selected, corresponding NMOS transistors 218 and 220 are turned on, corresponding NMOS transistors 210 and 212 are also turned on, corresponding PMOS transistors 114a and 114b are turned off, and the sense amplifier 112 is allowed to access the bit stored in the selected memory cell 104 through corresponding bit lines BL and BL'. Then, on an edge of control signal CTRL, the sense amplifier 112 is triggered to detect voltages on bit lines BL and BL', amplify a differential voltage across bit lines BL and BL', and output the amplified differential voltage.

Due to parasitic resistances and capacitances, bit lines BL and BL' corresponding to the selected memory cell 104 do not instantly exhibit the bit stored in the selected memory cell 104. Rather, if the bit stored in the selected memory cell 104 is a logic low, the corresponding bit line BL is gradually discharged from a precharged logic high state to a logic low state. Conversely, if the bit stored in the selected memory cell 104 is a logic high, the corresponding bit line BL' is gradually discharged from a precharged logic high state to a logic low state. A read margin is the differential voltage across the corresponding pair of bit lines BL and BL' when the sense amplifier 112 is triggered to detect the voltages on bit lines BL and BL'. Because the sense amplifier 112 can only detect a differential voltage above a certain level, e.g., 100 mV, a small read margin, if below that certain level, may result in a read failure. To avoid a read failure, it is desirable to delay the triggering of the sense amplifier 112 to allow the differential voltage across bit lines BL and BL' to develop and exceed the detectable level of the sense amplifier 112, i.e., to ensure a read margin exceeding the detectable level of the sense amplifier 112. One technique for delaying the triggering of the sense amplifier 112 is to use a tracking circuit, a conventional example of which is shown in FIG. 3.

In FIG. 3, a tracking circuit 302 is shown to include a pair of dummy bit lines DBL and DBL' and several tracking cells 304. A conventional tracking circuit, such as tracking circuit 302, may include one or more tracking cells 304. Tracking circuit 302 receives and delays control signal CTRL. A control circuit 306 is coupled between tracking circuit 302 and the sense amplifier 112 for receiving the delayed control signal CTRL and generating a clock signal for the sense amplifier 112. An example of control circuit 306 is an inverter that simply inverts the delayed control signal CTRL. FIG. 3 shows that dummy bit line DBL is coupled to power supply voltage VDD through a precharging PMOS transistor 308.

FIG. 4 shows the detailed structure of an example tracking cell 304, which includes six transistors, i.e., PMOS transistors 310 and 312 and NMOS transistors 314, 316, 318, and 320. With reference back to FIG. 2, it can be seen that tracking cell 304 has a structure similar to memory cell 104, except that the gates of PMOS transistor 310 and NMOS transistor 314 are coupled to power supply voltage VDD, and that the gate of NMOS transistor 318 is coupled to control signal CTRL. Also as shown in FIG. 4, dummy bit line DBL' is floating and not used, while dummy bit line DBL is coupled to the sense amplifier 112 through control circuit 306 for generating the clock signal for the sense amplifier 112. For reasons that will become clear below, in some conventional designs only the NMOS transistor 318 (sometimes referred to as the n-channel pass-gate) and the PMOS transistor 314 (sometimes referred to as the pull-down transistor) are retained, with the PMOS transistors 310 and 312 and the NMOS transistors 316 and 320 being omitted.

When memory array 102 is not accessed, control signal CTRL is at logic 0, and dummy bit line DBL is pre-charged to a voltage level approximately equal to VDD. When a memory cell 104 of memory array 102 is being accessed, control signal CTRL changes to logic high, turning off PMOS transistor 308 and turning on NMOS transistor 318. At the same time, word line signal WL is at logic high, and NMOS transistor 320 is turned on. Because NMOS transistor 314 is always turned on, precharged dummy bit line DBL is discharged through NMOS transistors 318 and 314. When the voltage on dummy bit line DBL drops below a flipping point, control circuit 306 generates a clock signal and the sense amplifier 112 is triggered. Therefore, the sense amplifier 112 is now triggered not by control signal CTRL, but rather, by the clock signal generated by control circuit 306, which represents control signal CTRL delayed by the process of discharging dummy bit line DBL. Because tracking cell 304 has a structure similar to memory cell 104, the process of discharging dummy bit line DBL resembles the discharging process of bit lines BL or BL' of memory cells 104. At the same time, control signal CTRL or a signal synchronized to control signal CTRL is used, without delay, to select and activate one of memory cells 104.

As discussed above, the tracking circuit 302 is used to control the timing delay from the moment the wordline WL is turned on to the moment the sense amplifier 112 is triggered. It is important that the tracking circuit 302 provide a timing delay for triggering the sense amplifier 112 that closely tracks the actual time required to discharge the bit line BL or BL' associated with the selected memory cell 104. For example, if the delay is too short, it may cause a read failure because the read margin of memory device 100 will be below the differential voltage required to correctly read out the bit content of the memory cell 104 when the sense amplifier 112 is triggered. Conversely, if the delay is too long, it may hurt performance because the read margin of memory device 100 may be significantly higher than the differential voltage required to correctly read out the bit content of the memory cell 104 when the sense amplifier 112 is triggered, resulting in unnecessary power consumption, slower operating speeds, etc.

The time required to discharge the precharged bit line BL or BL' is determined by the memory bit cell read current (Iread) of the memory device 100. Similarly, the time period required to discharge the precharged dummy bit line DBL, and hence, the timing delay before the sense amplifier 112 is triggered, depends on the drive current of the tracking circuit 302 (also referred to herein as the "tracking current"). There are several conventional techniques for correlating the tracking current of the tracking circuit 302 to the read current Iread of the memory device 100 in an attempt to achieve a desired read margin, each of which has associated drawbacks. In a first approach (the "single cell based" approach), the tracking current is adjusted by fabricating a given number of tracking cells 304 into the tracking circuit 302. Each additional tracking cell 304 in the conventional tracking circuit 302 proportionally increases the tracking current. So, for example, if a tracking circuit 302 includes one tracking cell 304 to provide a tracking current of 1× the read current Iread (read as 1 "times" the read current), a second tracking cell 304 will increase the tracking current to 2× the read current Iread, a third tracking cell 304 will increase the tracking current to 3× the read current Iread, and so on. Under this single cell based approach, however, each tracking cell's 304 random variation is so large in the latest process technology node (e.g., 65 nm and later), that it can no longer accurately track the average of the read current Iread in a real bitcell array. The tracking circuit 302 may also not be laid out in a true array like a real bitcell. This causes the tracking circuit 302 to be printed differently from the real bitcell array in later process technology nodes, leading to poor tracking or even hard failures. Further, the tracking current cannot achieve a current resolution of less than Iread, only one or multiples thereof.

In a second approach (the "logic based" approach), the size of the transistors of each tracking cell 304 is controlled to generate a predetermined current. Here, the tracking current and associated time period for discharging the precharged dummy bit line DBL is preset to correspond to the expected time required to discharge the bit line BL or BL' associated with the selected memory cell 104. Even though this logic based approach can compensate for random device variations by using large width and/or length dimensions for the transistors of tracking cell 304 or using multiple devices to average out random variation, it does not track the read current Iread because it has different dimension parameters, threshold voltages, etc., from the real bitcell array transistors.

SUMMARY

Exemplary embodiments are directed to systems and methods for tracking semiconductor memory read current.

According to one embodiment, a memory device comprises a memory array, a sense amplifier, and a tracking circuit. The memory array is formed of a plurality of memory cells. The sense amplifier is for accessing the memory array. The tracking circuit is for tracking memory read current of the memory array. The tracking circuit comprises one or more columns of tracking cells. Each column is coupled to a corresponding bit line to provide a drive current on the bit line for triggering a memory read operation by the sense amplifier. At least one of the columns comprises two tracking cells connected in series to each other.

According to another embodiment, a method of reading values stored in a memory array formed of a plurality of memory cells comprises: tracking memory read current of the memory array via a tracking circuit comprising one or more columns of tracking cells; providing a drive current on corresponding bit lines of the one or more columns of tracking cells based on the tracked memory read current, wherein at least a portion of the drive current is provided through a series connection of at least two tracking cells in one of the columns; and triggering a sense amplifier to perform a memory read operation based on the provided drive current.

According to another embodiment, a memory device comprises: a memory array formed of a plurality of memory cells; a sense amplifier for accessing the memory array; means for tracking memory read current of the memory array using one or more columns of tracking cells; means for connecting at least two tracking cells in a first column in series to each other; means for providing a drive current on corresponding bit lines of the one or more columns of tracking cells based on the tracked memory read current, at least a portion of the drive current being provided through the series connection of the at least two tracking cells; and means for triggering the sense amplifier to perform a memory read operation based on the provided drive current.

According to another embodiment, a method of reading values stored in a memory array formed of a plurality of memory cells comprises: step for tracking memory read current of the memory array via a tracking circuit comprising one or more columns of tracking cells; step for providing a drive current on corresponding bit lines of the one or more columns of tracking cells based on the tracked memory read current, wherein at least a portion of the drive current is provided through a series connection of at least two tracking cells in one of the columns; and step for triggering a sense amplifier to perform a memory read operation based on the provided drive current.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Aspects of the embodiments are disclosed in the following description and related drawings directed to such embodiments. Alternate embodiments may be devised without departing from the scope of the invention. Additionally, well-known elements used and applied in the embodiments will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the various embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, various aspects may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Techniques are disclosed herein for providing a timing delay using a programmable tracking circuit to trigger a sense amplifier circuit that reads data stored in memory cells of a memory array. For the reasons discussed in the Background, it is important that the timing delay track the actual time required to discharge a bit line BL or BL' associated with a selected memory cell, and the timing delay is determined by the tracking current of the tracking circuit.

Figure 1:
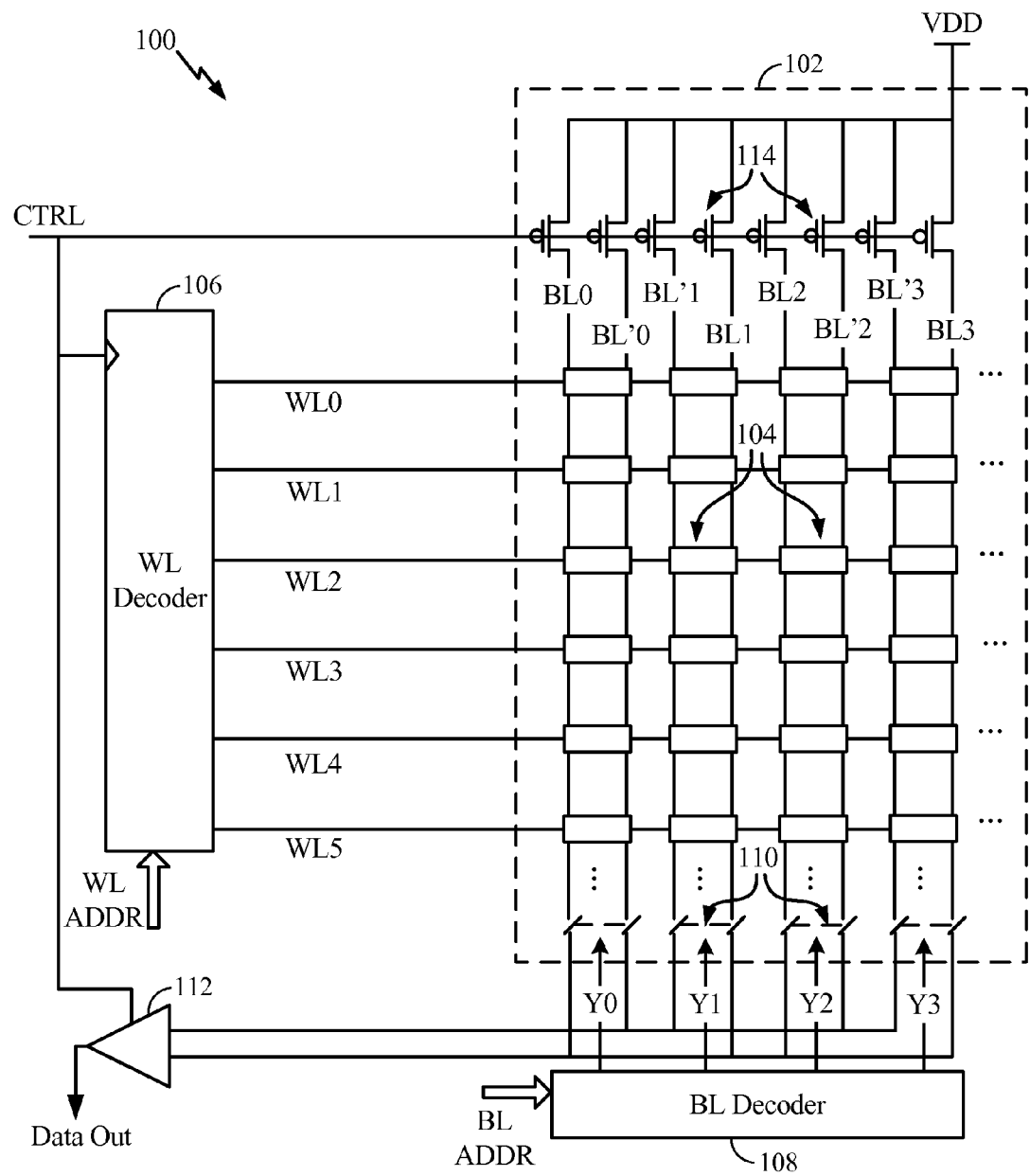
FIG. 1 illustrates a portion of an example conventional memory device.
Figure 2:
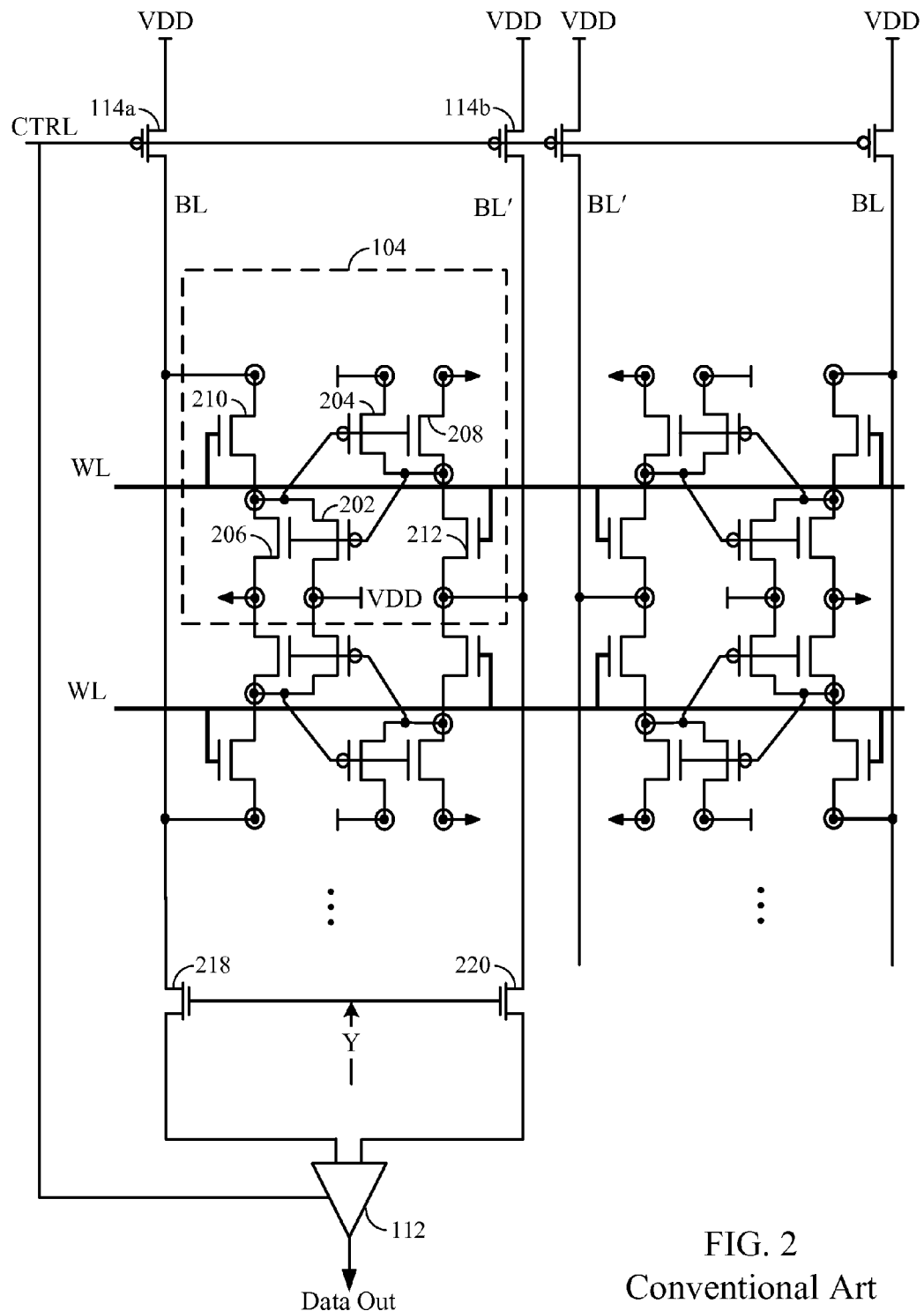
FIG. 2 illustrates a conventional 6-transistor memory structure.
Figure 5:
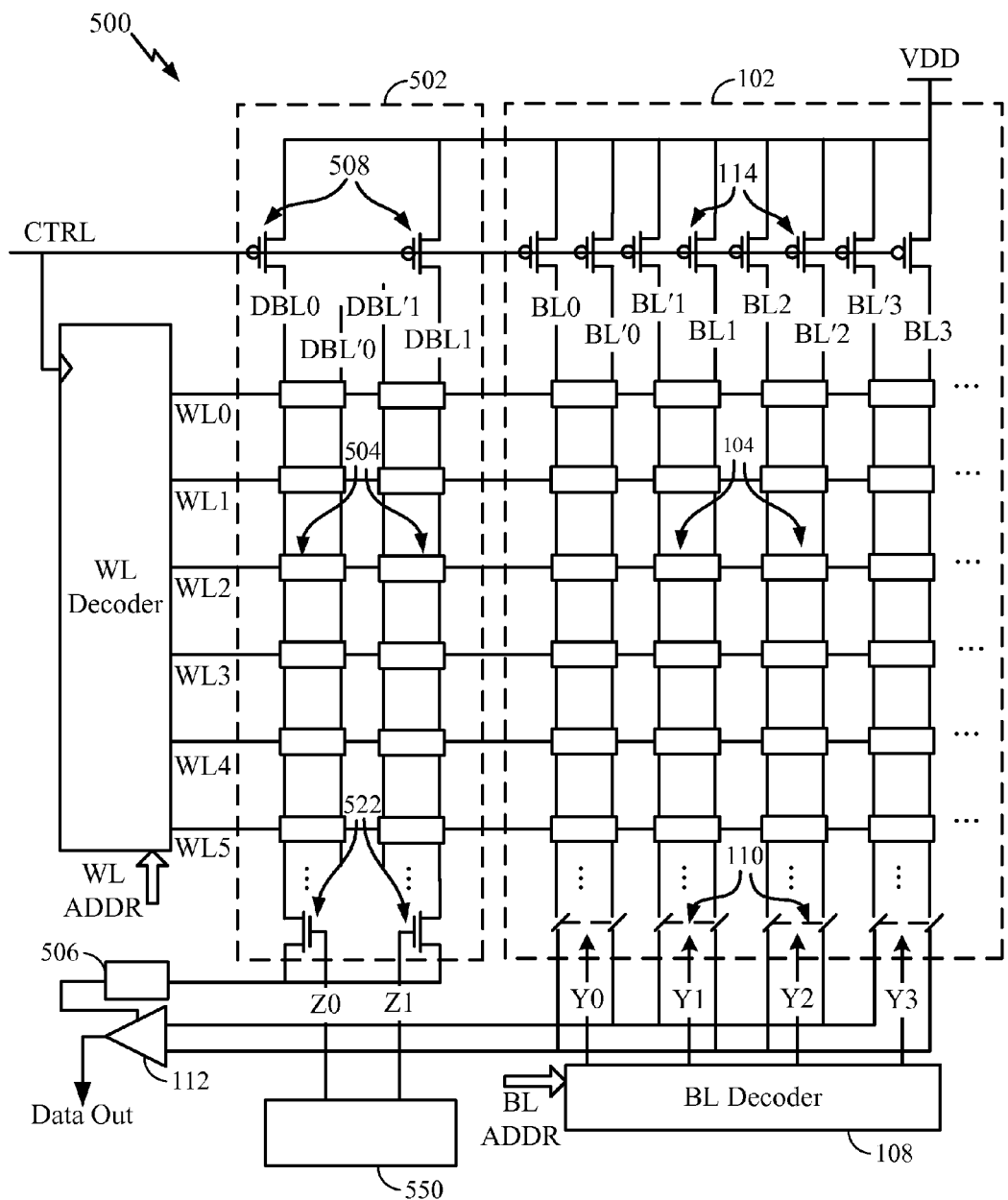
FIG. 5 illustrates a portion of a memory device including a tracking circuit according to an example embodiment.

FIG. 5 illustrates a portion of a memory device 500 including a tracking circuit according to an example embodiment. Memory device 500 includes one or more memory arrays 102 as described in more detail above with reference to FIG. 1. Each memory array 102 includes a plurality of memory cells 104 arranged in a plurality of rows and a plurality of columns, each row corresponding to a word line WL (WL0, WL1, . . . ) and each column corresponding to a pair of complementary bit lines, BL and BL' ((BL0, BL'0), (BL1, BL'1), (BL2, BL'2), etc.). Memory device 500 further includes a word line decoder 106, a bit line decoder 108, switches 110, a sense amplifier 112 coupled to bit lines BL and BL', and a plurality of precharging PMOS transistors 114 each coupling a corresponding bit line BL or BL' to a power supply voltage VDD, as described above with reference to FIG. 1. Memory cells 104 may comprise any suitable structure, such as the conventional 6-transistor structure shown in FIG. 2.

Memory device 500 further includes a tracking circuit 502. As shown, the tracking circuit 502 includes one or more columns of tracking cells 504. Two columns of five tracking cells 504 each are shown in FIG. 5 for illustration purposes, but it will appreciated that a greater or fewer number of columns including a greater or fewer number of tracking cells 504 may be employed as desired for a given application. In general, the tracking circuit 502 uses the same front-end of the line (FEOL) patterning as the memory array 102 but with modified metal layer connections. Using the same FEOL patterning allows the tracking circuit 502 to better track the real memory array 102 across semiconductor process corners.

The tracking circuit 502 is shown to include a pair of dummy bit lines DBL and DBL' (DBL1, DBL'1, DBL2, DBL'2, etc.) for each column of tracking cells 504. The tracking circuit 502 receives and delays the control signal CTRL to provide an output to a control circuit 506 coupled between the tracking circuit 502 and the sense amplifier 112. The output of the control circuit 506 acts as a clock signal for the sense amplifier 112. An example of control circuit 506 is an inverter that simply inverts the delayed control signal CTRL. In some designs, the dummy bit line DBL may be passed directly to the sense amplifier 112 and therefore not include a control circuit 506. FIG. 5 shows that each dummy bit line DBL is coupled to the power supply voltage VDD through a corresponding precharging PMOS transistor 508, while DBL' is floating and not used.

The columns of the tracking circuit 502 are connected in parallel to the control circuit 506 such that each contributes a given drive current adding up to the total tracking current. The tracking circuit 502 is programmable in the sense that the number of columns, and hence, the total tracking current, is dynamically adjustable by an array controller 550, for example, that selectively enables or disables each column through a corresponding switch 522 (e.g., NMOS transistor) coupled to the column using a corresponding bit line signal Z (Z0, Z1, etc.). In other embodiments, a similar word line controller (not shown) may be used to selectively enable or disable each word line (WL0, WL1, . . . ). Returning to the design of FIG. 5, as will be described in more detail below, each column may be configured with one of several different tracking cell arrangements to contribute a desired amount of drive current to the total tracking current. Some tracking cell arrangements disclosed herein are capable of providing a fraction of the read current Iread while still using the FEOL pattern as the memory array 102. Accordingly, the array controller 550 can program the tracking current provided by the tracking circuit 506 over a wide range of values and fine tune it with a relatively narrow resolution.

Figure 6:
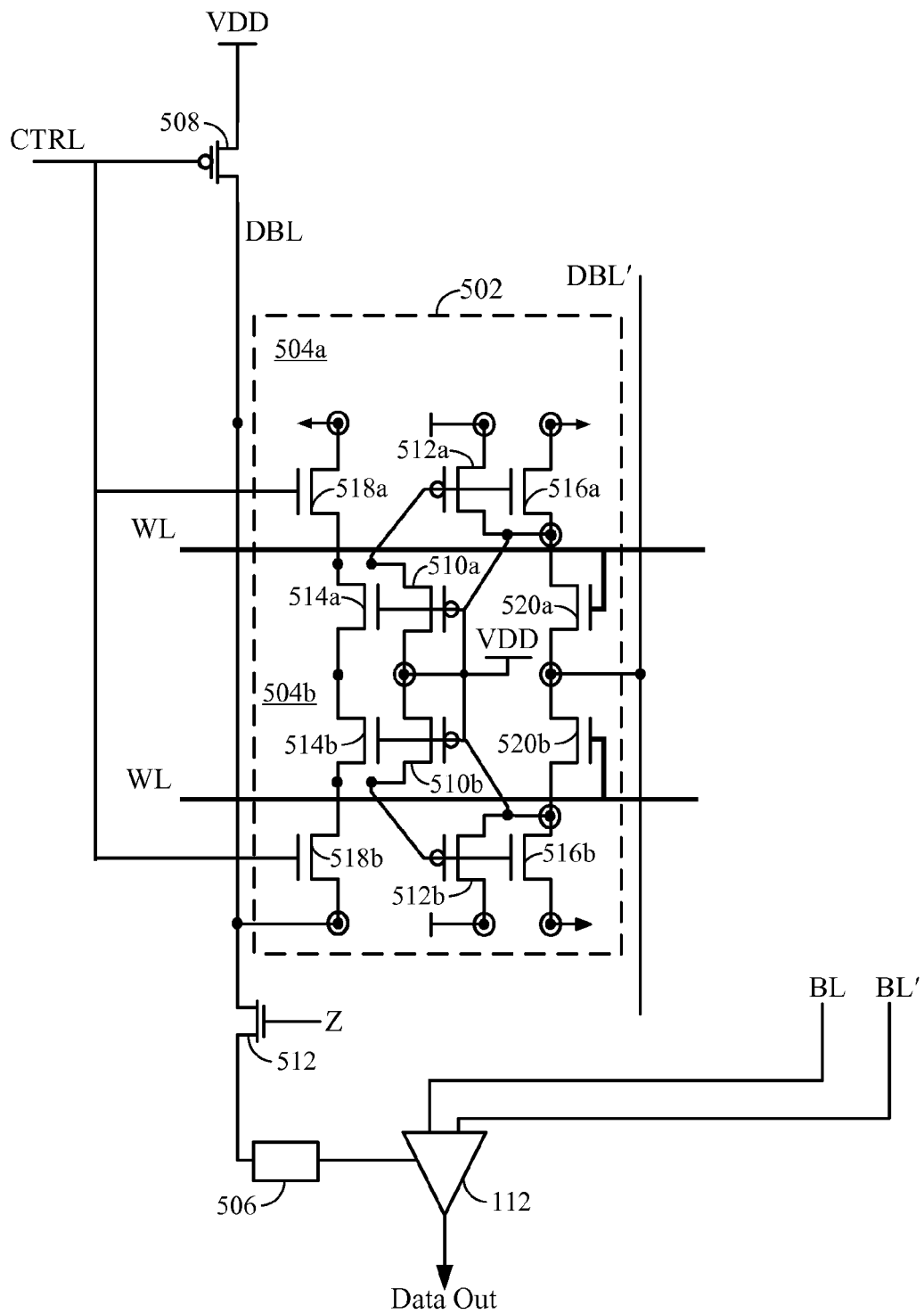
FIG. 6 illustrates an example tracking cell arrangement for providing 0.5× the read current Iread.
Figure 7:
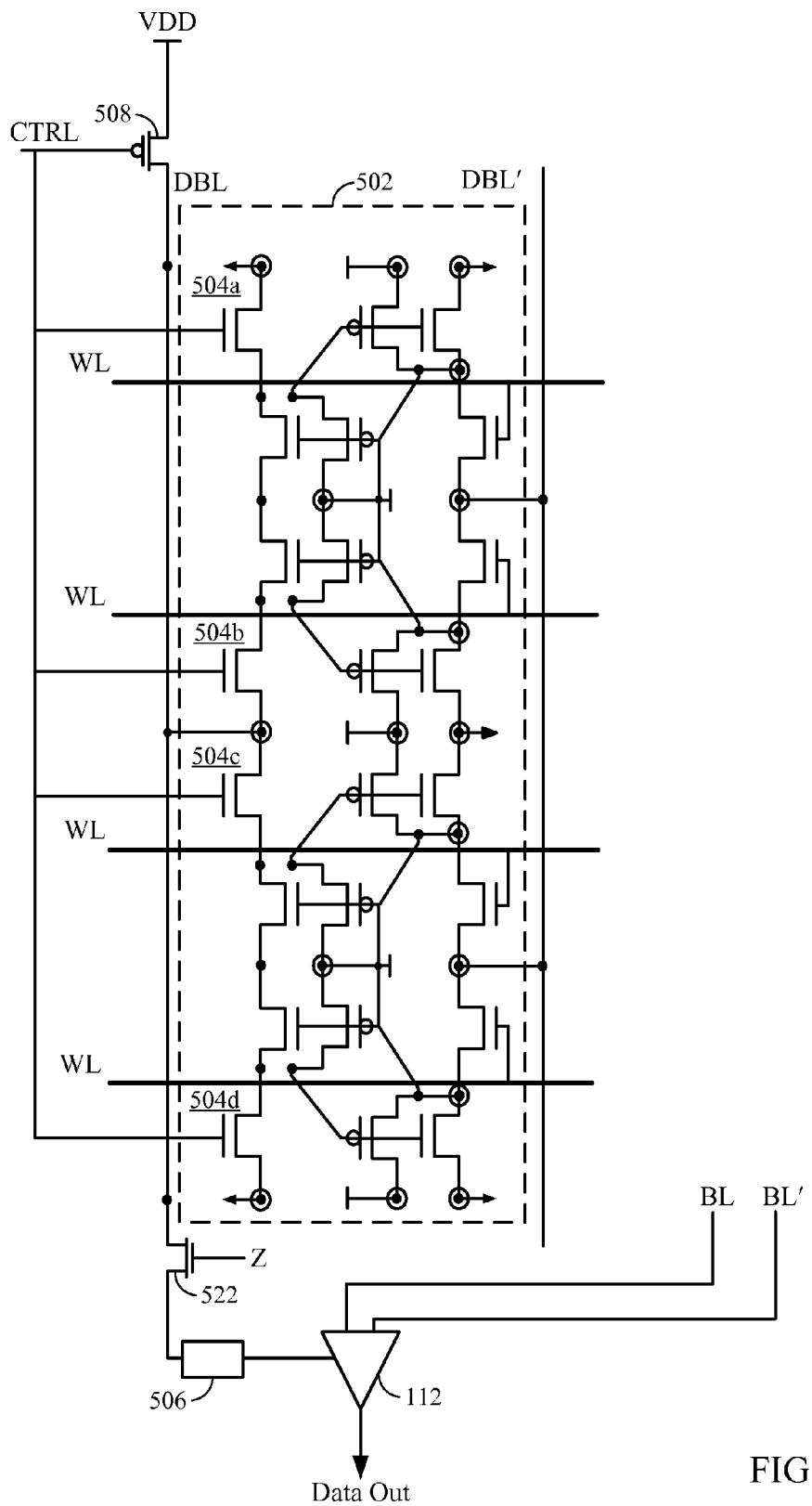
FIG. 7 illustrates an example tracking cell arrangement for providing 1× the read current Iread.
Figure 8:
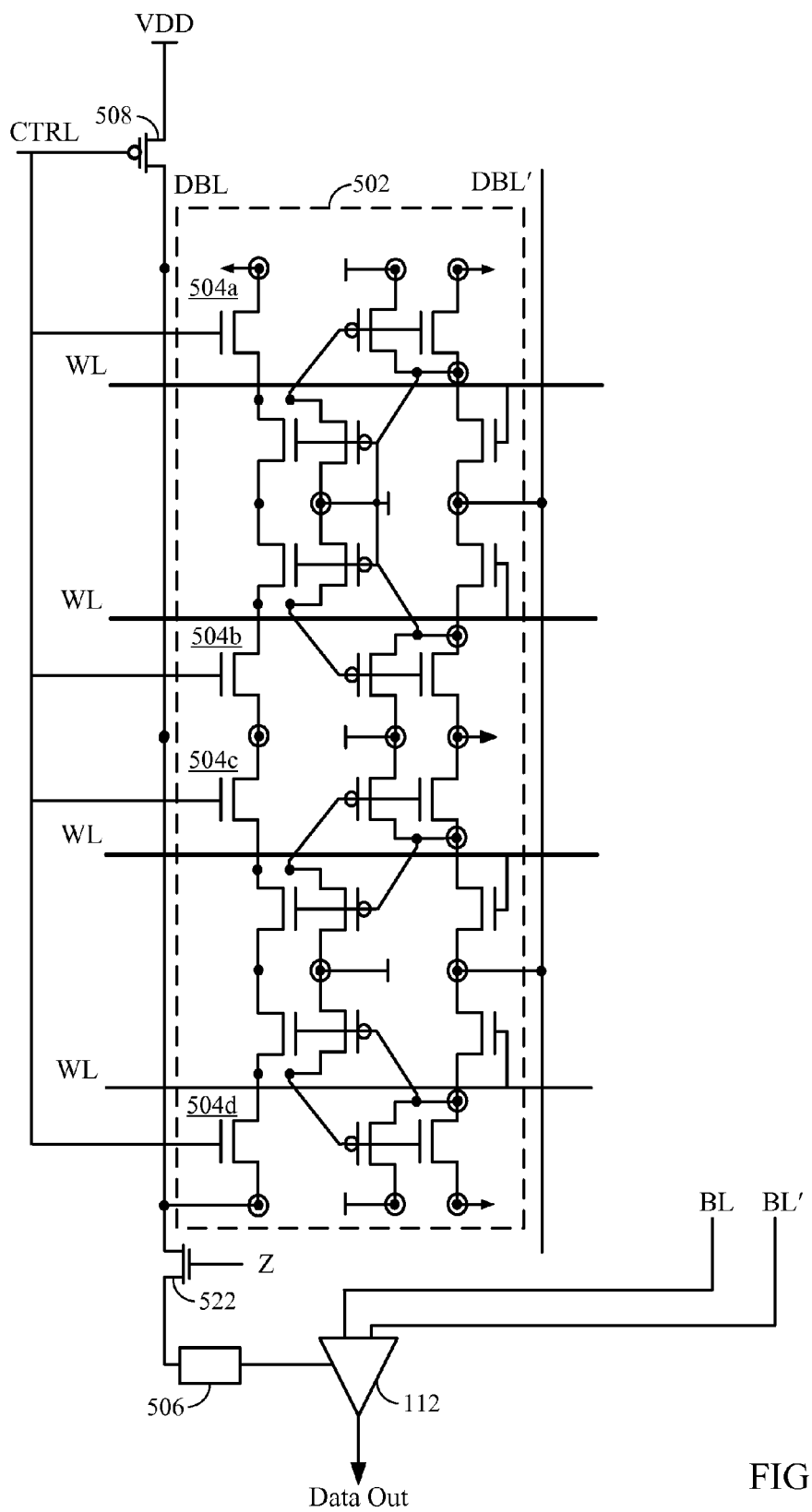
FIG. 8 illustrates an example tracking cell arrangement for providing 0.25× the read current Iread.

FIGS. 6-8 below describe various tracking cell arrangements for providing different amounts of drive current. As mentioned above, the tracking circuit 502 uses the same FEOL patterning as the memory array 102 but with modified metal layer connections. In general, to increase the tracking current beyond the read current Iread, the metal layer connections are modified to connect multiple tracking cells 504 in parallel within the column. To decrease the tracking current below the read current Iread, the metal layer connections are modified to disconnect one or more tracking cells 504 or connect them in series within the column. Further, both series and parallel connections can be used in concert to provide a given amount of drive current, e.g., 1× the read current Iread, but using more tracking cells 504 to reduce the total random variation caused by using only a relatively small number of tracking cells 504.

FIG. 6 illustrates an example tracking cell arrangement for providing 0.5× the read current Iread. Here, two tracking cells 504a and 504b are connected in series to cut their drive current in half. Each tracking cell 504a and 504b includes the same six transistor pattern as the memory cell 104, i.e., PMOS transistors 510a, 510b and 512a, 512b, and NMOS transistors 514a, 514b, 516a, 516b, 518a, 518b, and 520a, 520b, respectively. However, the gates of PMOS transistors 510a, 510b and NMOS transistors 514a, 514b are coupled to power supply voltage VDD, and the gates of NMOS transistors 518a, 518b are coupled to control signal CTRL. Also as shown in FIG. 5, dummy bit line DBL' is floating and not used, while dummy bit line DBL is coupled to the sense amplifier 112 through control circuit 506 for generating the clock signal for the sense amplifier 112.

In addition, the two tracking cells 504a and 504b are connected in series by removing (i.e., not depositing) the metal connections between (i) the drain of NMOS transistor 518a and the dummy bit line DBL, (ii) the source of NMOS transistor 518a and the gate of PMOS transistor 512a, and (iii) the source of NMOS transistor 518b and the gate of PMOS transistor 512b. The sources of NMOS transistors 514a and 514b are also disconnected from ground VSS, whereas the drain of NMOS transistor 518a is rerouted to ground VSS. (The drain of NMOS transistor 518b remains connected to the dummy bit line DBL, and acts as a single, shared connection to the dummy bit line DBL for the series connected tracking cells 504a and 504b.) For illustration purposes, the connector points of the removed metal connections are still shown in FIG. 6.

Connecting the two tracking cells 504a and 504b in series provides a tracking current of 0.5× the read current Iread. This leads to a finer resolution than, for example, the conventional single cell based approach discussed in the Background where only whole multiples of the read current Iread can be produced. Moreover, by using multiple tracking cells 504 in concert, random variation can be reduced by approximately the square root of N (i.e., the number of cells used in the series connection).

Two sets of series connected tracking cells 504 like those shown in FIG. 6 can be connected in parallel within a given column to provide the full 1× the read current Iread, but with the reduced random variation described above. FIG. 7 illustrates an example tracking cell arrangement for providing 1× the read current Iread. Here, a first set of series connected tracking cells 504a and 504b is connected in parallel to a second set of series connected tracking cells 504c and 504d using a single connection to the dummy bit line DBL. Each set of series connected tracking cells 504a, 504b and 504c, 504d contributes 0.5× the read current Iread for a total tracking current of the full 1× read current. Again, for illustration purposes, the connector points of the removed metal connections are still shown in FIG. 7.

In addition, more than two tracking cells 504 can be connected in series to provide even less than 0.5× the read current Iread, also with the reduced random variation described above. FIG. 8 illustrates an example tracking cell arrangement for providing 0.25× the read current Iread. Here, four tracking cells 504a, 504b, 504c and 504d are connected in series within a column using a single connection to the dummy bit line DBL (from tracking cell 504d) to provide 0.25× the read current Iread. Again, for illustration purposes, the connector points of the removed metal connections are still shown in FIG. 8.

Figure 3:
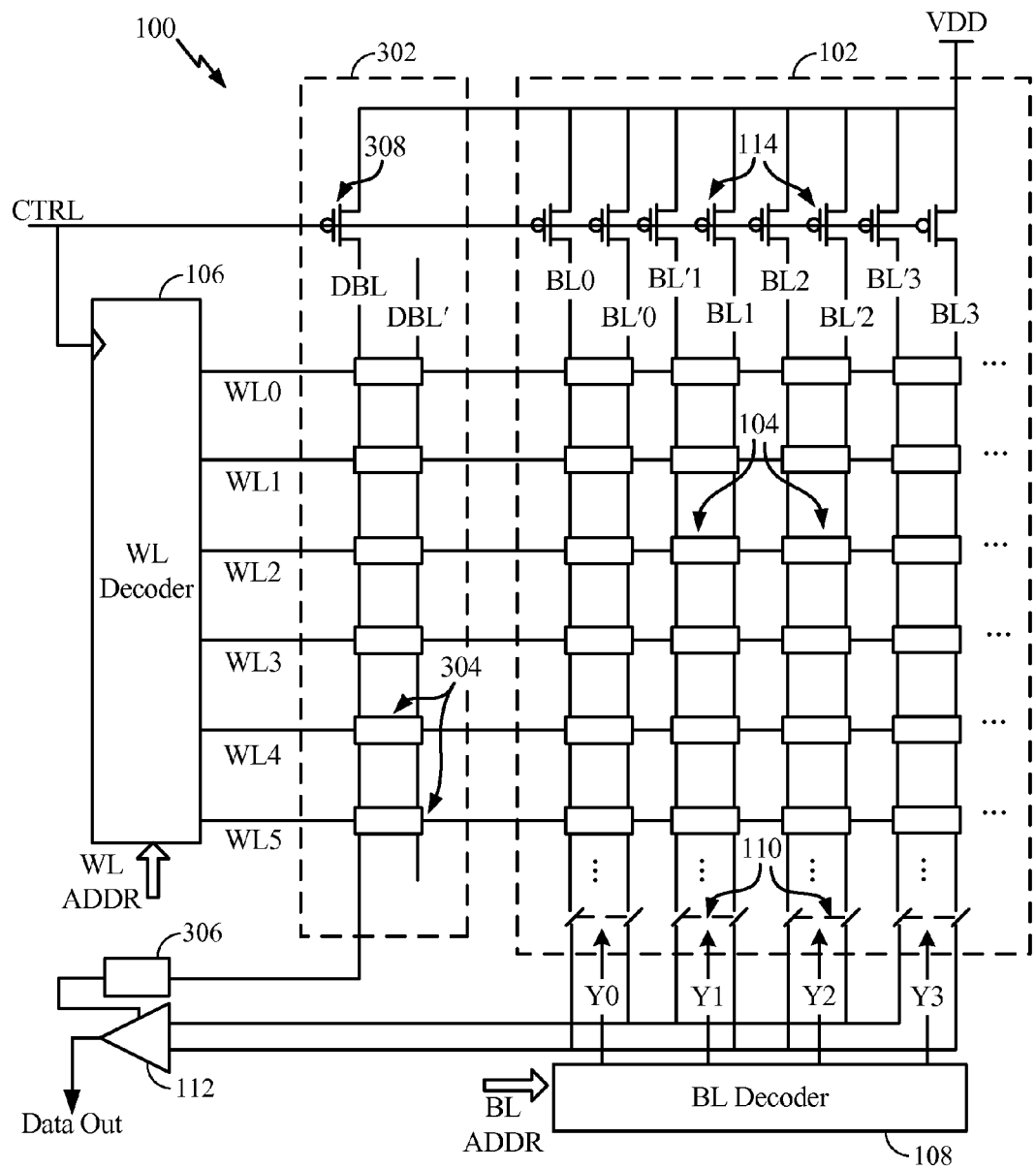
FIG. 3 illustrates a conventional tracking circuit that includes a pair of dummy bit lines DBL and DBL', and several tracking cells.
Figure 4:
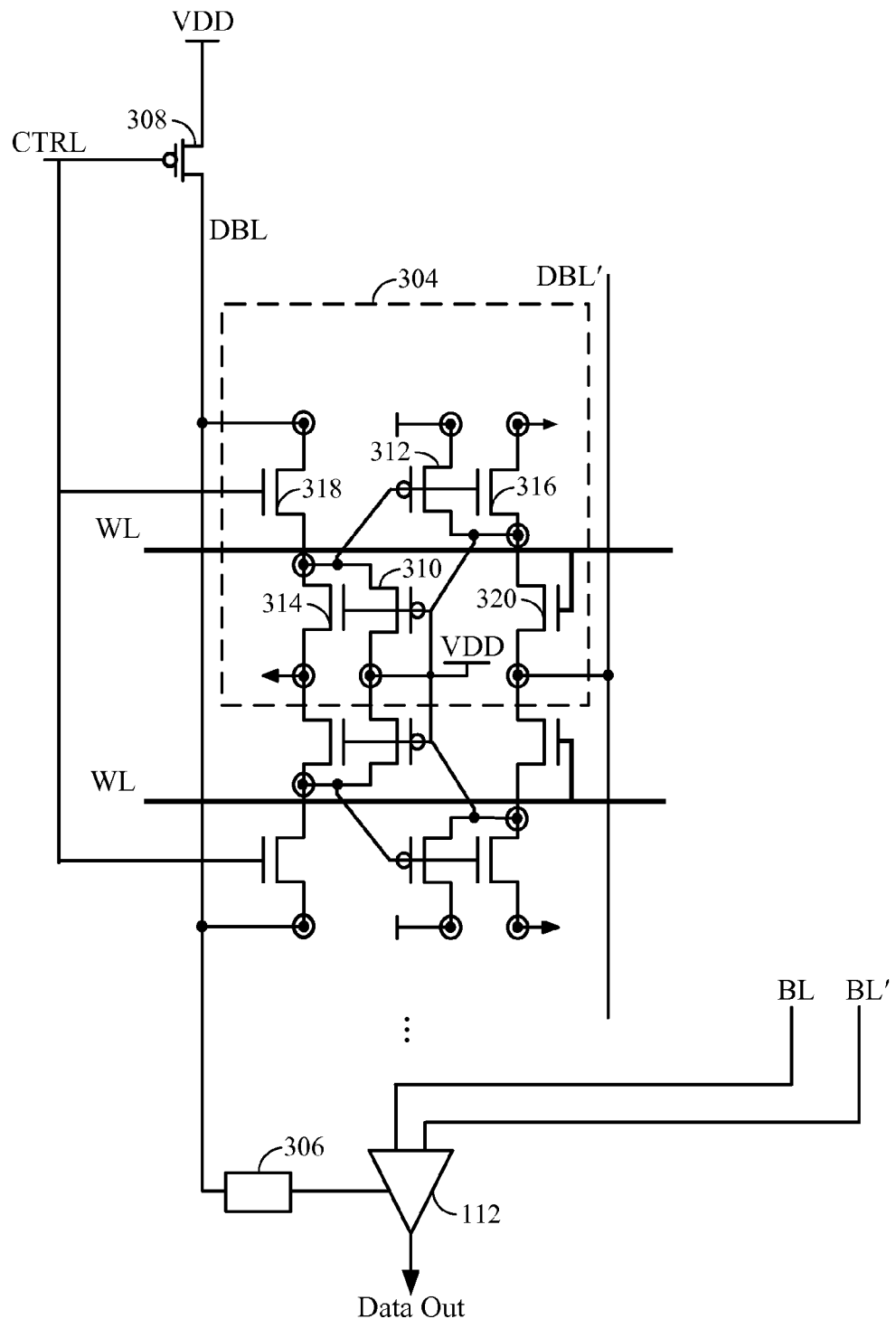
FIG. 4 shows the detailed structure of an example conventional tracking cell.

In some designs, one or more tracking cells 504 may be effectively disconnected (that is, "floated") from the tracking circuit 502 by removing (i.e., not depositing) any metal connection between the tracking cell 504 and the dummy bit line DBL. Thus, one or more tracking cells 504 may be prevented from contributing to the total tracking current without the need to modify the FEOL layout of the tracking circuit 502. Further, the tracking cells 504 may also be used singly, as in the conventional design described above with reference to FIGS. 3 and 4, to provide 1× the read current Iread.

As will be described below in more detail, the above tracking cell arrangements can be combined to create the desired one or more columns of tracking circuit 502 for a given application, and each column can be selectively activated or deactivated by the array controller 550 to program the desired final tracking current. In some designs, the array controller 550 receives a desired tracking current from a system controller (not shown) and selectively activates or deactivates the appropriate tracking cells 504 accordingly to achieve the desired tracking current. The particular desired tracking current is application specific and may be set by a system designer, for example, following memory fabrication to meet the various design specifications, etc., of the application.

Figure 9:
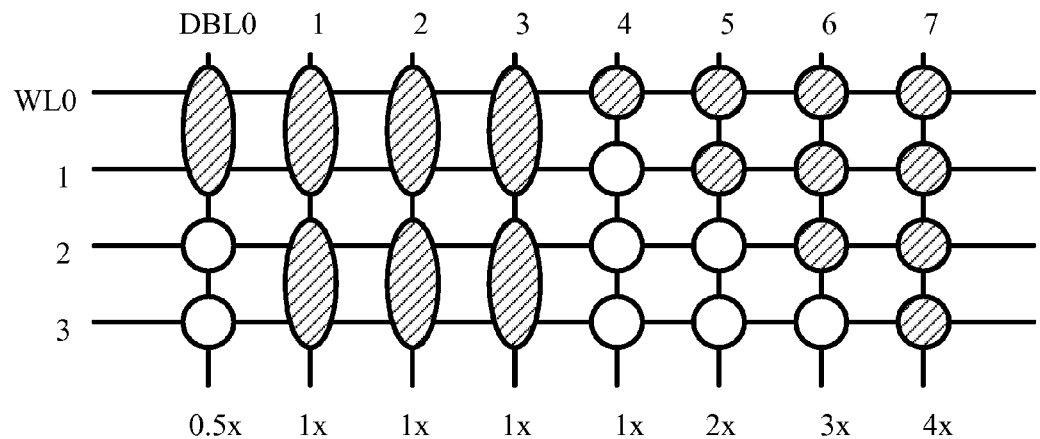
FIG. 9 illustrates an example 4 row by 8 column tracking circuit with a combination of tracking cell arrangements.

FIG. 9 illustrates an example 4 row by 8 column tracking circuit (e.g., one design of tracking circuit 502) with a combination of tracking cell arrangements. For simplicity, each tracking cell is illustrated merely as a given WL and DBL node. A shaded single circle over a given node indicates a tracking cell used singly and not in series with other tracking cells. A non-shaded single circle over a given node indicates a tracking cell that has been effectively disconnected from the tracking circuit, as described above. A shaded oval encompassing more than one node indicates that the tracking cells at those nodes are being used in concert and are connected in series as described above with reference to FIGS. 6-8. Each circle or oval therefore represents a given tracking cell arrangement with a corresponding drive current that is combined in parallel (i.e., constructively) with the other tracking cell arrangements in a given column. Accordingly, each column also has a corresponding drive current, and all active columns are similarly combined in parallel with one another to provide a final, programmable tracking current to control the triggering of the sense amplifier 112 via the control circuit 506 with a desired delay period.

Returning to the example tracking circuit of FIG. 9, the first column corresponding to DBL0 includes a pair of series connected tracking cells at WL0 and WL1, and two disconnected tracking cells at WL2 and WL3, leading to a drive current of 0.5× the read current Iread for the first column. The second, third, and fourth columns corresponding to DBL1, DBL2, and DBL3, respectively, each include a first pair of series connected tracking cells at WL0 and WL1, and a second pair of series connected tracking cells at WL2 and WL3, leading to a drive current of 1× the read current Iread for each column. The fifth column corresponding to DBL6 includes one singly connected tracking cell at WL0, and three disconnected tracking cells at WL1, WL2 and WL3, leading to a drive current of 1× the read current Iread for the fifth column. The sixth column corresponding to DBL5 includes two singly connected tracking cells at WL0 and WL1, and two disconnected tracking cells at WL2 and WL3, leading to a drive current of 2× the read current Iread for the sixth column. The seventh column corresponding to DBL6 includes three singly connected tracking cells at WL0, WL1 and WL2, and one disconnected tracking cell at WL3, leading to a drive current of 3× the read current Iread for the seventh column. The eighth column corresponding to DBL7 includes four singly connected tracking cells at WL0, WL1, WL2 and WL3, leading to a drive current of 4× the read current Iread for the eighth column.

Table 1 below summarizes a selected number of the different tracking current values achievable with the tracking cell array design of FIG. 9 using a minimum of four tracking cells for random variation averaging. In the table, an 'x' indicates which DBL(s) (i.e., which columns) to activate to achieve the indicated tracking current.

TABLE 1

| Current (xIread) | DBL0 | DBL1 | DBL2 | DBL3 | DBL4 | DBL5 | DBL6 | DBL7 | No. cells |
|---|---|---|---|---|---|---|---|---|---|
| 1 |  | x |  |  |  |  |  |  | 4 |
| 1.5 | x | x |  |  |  |  |  |  | 6 |
| 3 |  | x | x | x |  |  |  |  | 12 |
| 3.5 | x | x | x | x |  |  |  |  | 13 |
| 7 |  |  |  |  |  |  | x | x | 7 |
| 10 |  |  |  |  | x | x | x | x | 10 |

As shown, the tracking cell array design of FIG. 9 can be programmed to achieve a wide range of tracking current values with a resolution below 1× the read current, which allows this design to better control the timing delay from the moment a wordline WL is turned on to the moment the sense amplifier 112 is triggered.

Figure 10:
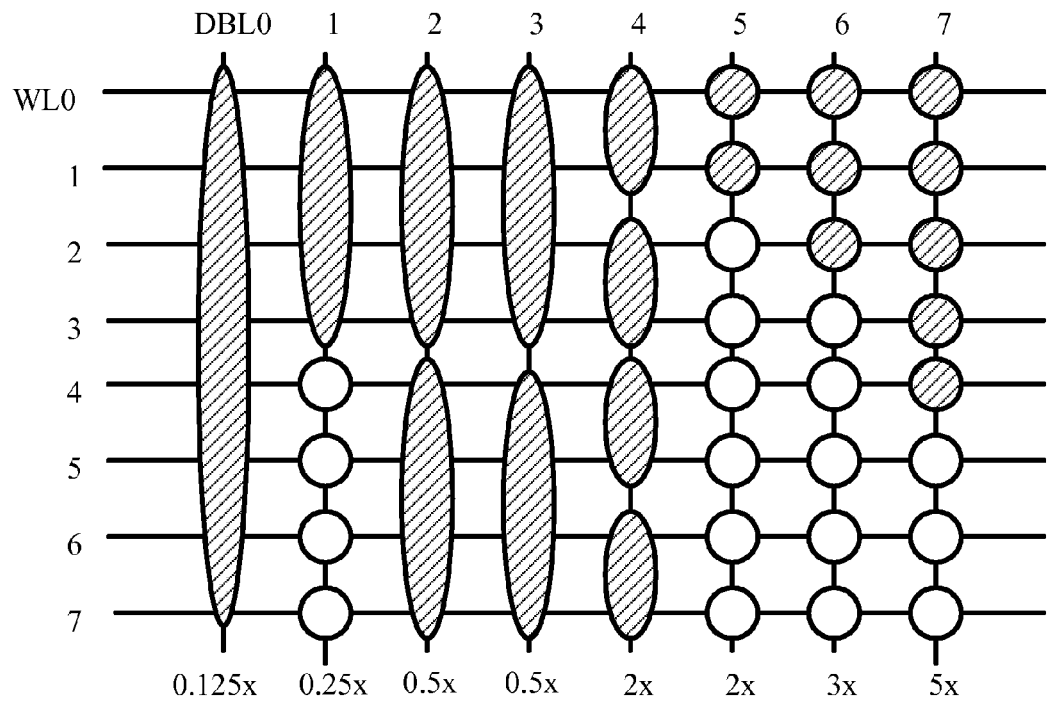
FIG. 10 illustrates an example 8 row by 8 column tracking circuit with a combination of tracking cell arrangements.

FIG. 10 illustrates an example 8 row by 8 column tracking circuit (e.g., another design of tracking circuit 502) with a combination of tracking cell arrangements. Like FIG. 9, each tracking cell is illustrated merely as a given WL and DBL node for simplicity, with a shaded single circle over a given node indicating a tracking cell used singly, a non-shaded single circle over a given node indicating a tracking cell that has been effectively disconnected from the tracking circuit, and a shaded oval encompassing more than one node indicating that the tracking cells at those nodes are being used in concert and are connected in series as described above with reference to FIGS. 6-8. Because the tracking circuit of FIG. 10 includes additional rows of tracking cells, it is able to provide a wider range with a finer resolution of tracking currents than the design of FIG. 9.

As shown in FIG. 10, the first column corresponding to DBL0 includes all eight tracking cells at WL0-WL7 connected in parallel, leading to a drive current of 0.125× the read current Iread for the first column. The second column corresponding to DBL1 includes a first set of four tracking cells WL0-WL3 connected in series, with the remaining tracking cells WL4-WL7 being disconnected, leading to a drive current of 0.25× the read current Iread for the second column. The third and fourth columns corresponding to DBL2 and DBL3, respectively, each include both a first set of four tracking cells WL0-WL3 connected in series, and a second set of four tracking cells WL4-WL7 also connected in series, leading to a drive current of 0.25× the read current Iread for each of the third and fourth columns. The fifth column corresponding to DBL2 includes a first set of two tracking cells WL0-WL1 connected in series, a second set of two tracking cells WL2-WL3 connected in series, a third set of two tracking cells WL4-WL5 connected in series, and a fourth set of two tracking cells WL6-WL7 connected in series, leading to a drive current of 2× the read current Iread for the second column. The sixth column corresponding to DBL5 includes two singly connected tracking cells WL0-WL1, with the remaining tracking cells WL2-WL7 being disconnected, leading to a drive current of 2× the read current Iread for the sixth column. The seventh column corresponding to DBL6 includes three singly connected tracking cells WL0-WL2, with the remaining tracking cells WL3-WL7 being disconnected, leading to a drive current of 3× the read current Iread for the seventh column. The eighth column corresponding to DBL7 includes five singly connected tracking cells WL0-WL4, with the remaining tracking cells WL5-WL7 being disconnected, leading to a drive current of 5× the read current Iread for the sixth column.

Table 2 below summarizes a selected number of the different tracking current values achievable with the tracking cell array design of FIG. 10 using a minimum of four tracking cells for random variation averaging. In the table, an 'x' indicates which DBL(s) (i.e., which columns) to activate to achieve the indicated tracking current.

example, compared to the single cell based conventional approach, a finer resolution (e.g., 0.125× Iread vs. 1× Iread) with smaller random variation (e.g., approximately 2× lower with four tracking cells) is achievable. Further, the techniques presented herein are more process friendly because they do not alter the FEOL processes and, because of this, they are able to track a real bitcell array better across process corners. Compared to the logic based conventional approach, the techniques presented herein are able to better track the real bitcell array across temperature, VDD and process corners. This results in a larger sense margin and leads to better yield and/or improved performance of a given memory device.

Figure 11:
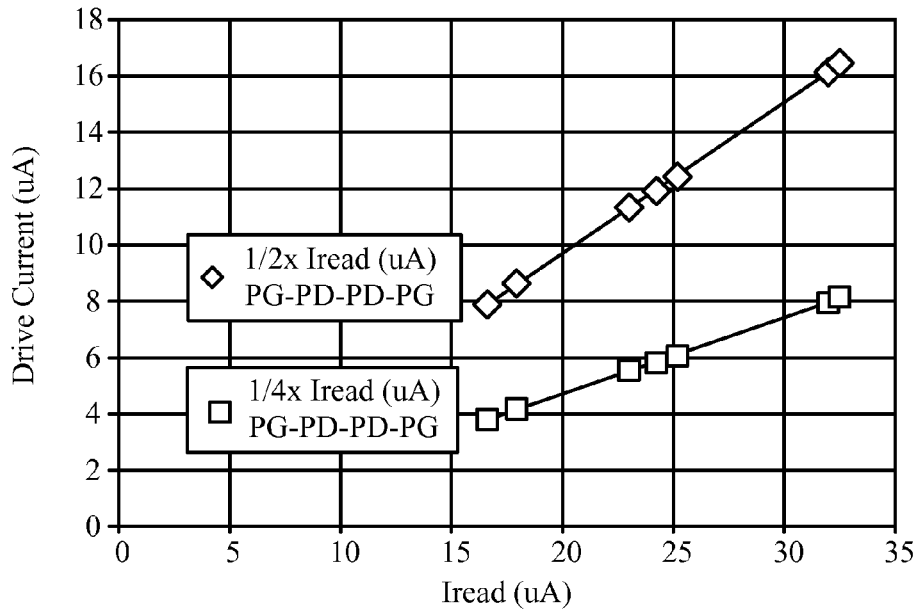
FIG. 11 illustrates simulation results showing the drive current from various series connected tracking cell arrangements.
Figure 12:
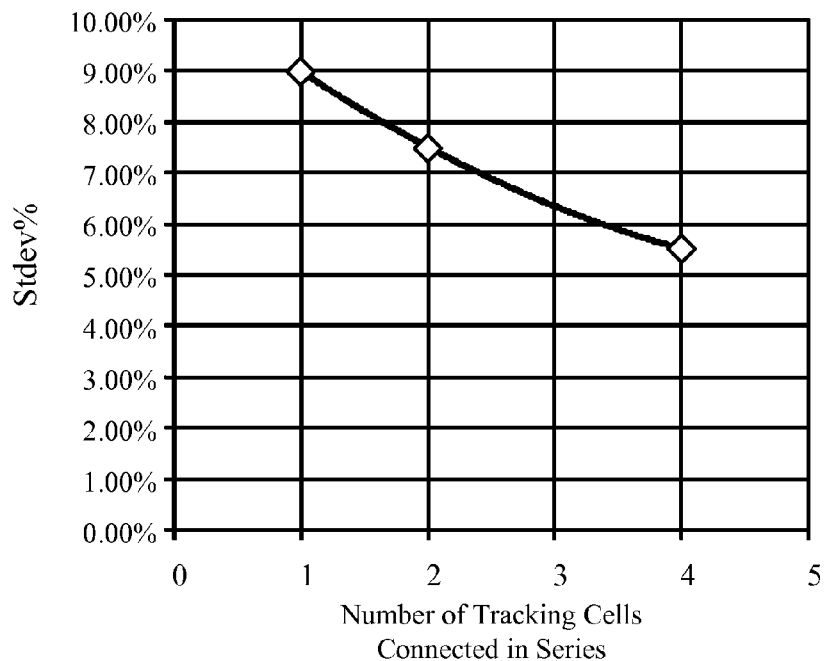
FIG. 12 illustrates simulation results showing the random variation in read current Iread as a function of the number of series connected tracking cells.

FIGS. 11 and 12 show simulation data highlighting some of the performance improvements. FIG. 11 illustrates simulation results showing the drive current from various series connected tracking cell arrangements. As shown, series connected tracking cells tend to exhibit a linear relationship with single cell read current Iread across temperature, VDD, and process corners. FIG. 12 illustrates simulation results showing the random variation in read current Iread as a function of the number of series connected tracking cells. The simulation of FIG. 12 was performed as a Monte Carlo simulation, and shows that the random variation (expressed as a percentage) drops as the number of tracking cells used in a series connection increases.

Figure 13:
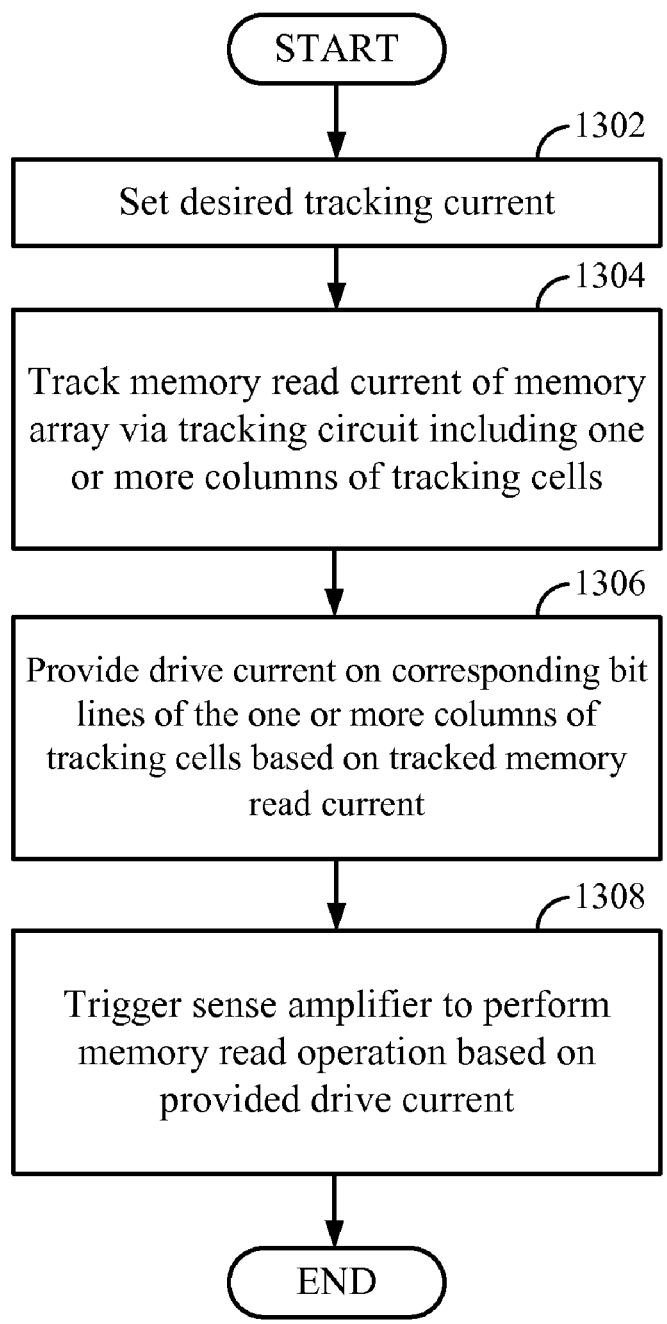
FIG. 13 is a flowchart illustrating a method of reading values stored in a memory array formed of a plurality of memory cells according to an example embodiment.

FIG. 13 is a flowchart illustrating a method of reading values stored in a memory array formed of a plurality of memory cells according to an example embodiment. When the tracking circuit includes at least two columns, a system designer or the like may initially set the desired tracking current by individually coupling each column to or decoupling each column from the sense amplifier using an array controller (block 1302). The memory read current Iread of the memory array is then tracked via a tracking circuit including the one or more columns of tracking cells (block 1304). A

TABLE 2

| Current (xIread) | DBL0 | DBL1 | DBL2 | DBL3 | DBL4 | DBL4 | DBL6 | DBL7 | No. cells |
|---|---|---|---|---|---|---|---|---|---|
| 1 | | | x | | | | | | 4 |
| 1.5 | x | x | | | | | | | 6 |
| 2 | | x | x | | | | | | 8 |
| 2.5 | x | x | x | | | | | | 10 |
| 3 | | x | x | x | | | | | 12 |
| 3.5 | x | x | x | x | | | | | 13 |
| 4 | | x | x | | | x | | | 10 |
| 4.5 | x | x | x | | | x | | | 12 |
| 5 | | x | x | | | | x | | 11 |
| 5.5 | x | | | | | x | x | | 7 |
| 6 | | | | | x | x | x | | 6 |
| 6.5 | x | | | | | x | | x | 8 |
| 7 | | | | | | | x | x | 7 |

As shown, the tracking cell array design of FIG. 10 can be programmed to achieve a wide range of tracking current values with a resolution below 1× the read current, which also allows this design to better control the timing delay from the moment a wordline WL is turned on to the moment the sense amplifier 112 is triggered.

In general, the techniques presented herein provide a tracking circuit able to track average read current Iread from a memory cell array and which is easily programmable over a large range with a fine resolution, has relatively low random variation, uses a small chip area, and is process friendly for ease of fabrication. Accordingly, example embodiments of the present disclosure provide various advantages over the conventional approaches described in the Background. For drive current is then provided on corresponding bit lines of the one or more columns of tracking cells based on the tracked memory read current (block 1306). According to various embodiments, at least a portion of the drive current is provided through a series connection of at least two of the tracking cells. The sense amplifier is then triggered to perform a memory read operation based on the provided drive current (block 1308).

It will be appreciated that integrated circuits including the memory devices described herein may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including a memory device as disclosed herein.

The foregoing disclosed devices and methods can be designed and can be configured into GDSII and GERBER computer files, stored on a computer-readable medium. These files are in turn provided to fabrication handlers who fabricate devices based on these files. The resulting products are semiconductor wafers that are then cut into semiconductor die and packaged into a semiconductor chip. The chips are then employed in devices described above.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM, a solid state memory device, such as a flash-drive, or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Accordingly, an embodiment can include a computer readable medium embodying a method for tracking semiconductor memory read current. Accordingly, the various embodiments are not limited to illustrated examples and any means for performing the functionality described herein are included.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A memory device, comprising:
a memory array formed of a plurality of memory cells;
a sense amplifier configured to access the memory array and
a tracking circuit configured to track memory read current of the memory array, the tracking circuit comprising one or more columns of tracking cells, each column being coupled to a corresponding bit line to provide a drive current on the corresponding bit line to trigger a memory read operation by the sense amplifier, wherein at least one of the columns comprises a first set of at least two tracking cells connected in series to each other and a second set of at least two tracking cells connected in series to each other, the first set and the second set being connected in parallel to the corresponding bit line of the at least one column.

2. The memory device of claim 1, wherein the at least two tracking cells connected in series to each other in at least one of the first set or the second set are coupled to the corresponding hit line of the at least one column through a single, shared connection and provide the drive current less than either tracking cell individually.

3. The memory device of claim 1, wherein the tracking cells of the tracking circuit and the memory cells of the memory array share a common front-end of the line transistor layout.

4. The memory device of claim 3, wherein the tracking cells of the tracking circuit comprise different metal layer connections than the memory cells of the memory array.

5. The memory device of claim 1, further comprising a control circuit configured to receive a control signal from the tracking circuit and provide a clock signal to the sense amplifier based on the control signal received from the tracking circuit.

6. The memory device of claim 1, wherein at least one of the tracking cells in at least one of the columns is disconnected from the corresponding bit line of the at least one column.

7. The memory device of claim 1, wherein the memory device is integrated into an electronic device that comprises one or more of a set top box, a music player, a video player, an entertainment unit, a navigation device, a communications device, a personal digital assistant (PDA), a fixed location data unit, or a computer.

8. The memory device of claim 1, wherein the memory device is integrated into at least one semiconductor die.

9. A memory device, comprising:
a memory array formed of a plurality of memory cells;
a sense amplifier configured to access the memory array; and
a tracking circuit configured to track memory read current of the memory array, wherein the tracking circuit comprises at least two columns of tracking cells, the tracking circuit comprising at least two columns of tracking cells, each of the at least two columns being coupled to a corresponding bit line to provide a drive current on the corresponding bit line to trigger a memory read operation by the sense amplifier, at least one of the at least two columns comprises at least two tracking cells connected in series to each other; and
an array controller configured to individually couple each of the at least two columns to or decouple each of the at least two columns from the sense amplifier.

10. The memory device of claim 9, wherein the at least two columns comprise different tracking circuit cell arrangements and provide different drive currents.

11. The memory device of claim 9, wherein the array controller is further configured to select one or more of the at least two columns to individually couple to or decouple from the sense amplifier based on a desired total current drive for the sense amplifier.

12. A method of reading values stored in a memory array formed of a plurality of memory cells, the method comprising:
tracking memory read current of the memory array via a tracking circuit comprising one or more columns of tracking cells;
providing a drive current on corresponding bit lines coupled to the one or more columns of tracking cells based on the tracked memory read current, wherein at least a portion of the drive current is provided through a first set of at least two tracking cells connected in series to each other in at least one of the columns and a second set of at least two tracking cells connected in series to each other in the at least one column, the first set and the second set being connected in parallel to the corresponding bit line of the at least one column; and
triggering a sense amplifier to access the memory array to perform a memory read operation based on the provided drive current.

13. The method of claim 12, wherein the at least two tracking cells connected in series to each other in at least one of the first set or the second set are coupled to the corresponding bit line of the at least one column through a single, shared connection and provide the drive current less than either tracking cell individually.

14. A method of reading values stored in a memory array formed of a plurality of memory cells, the method comprising:
tracking memory read current of the memory array via a tracking circuit that comprises at least two columns of tracking cells;
providing a drive current on corresponding bit lines coupled to the at least two columns of tracking cells based on the tracked memory read current, wherein at least a portion of the drive current is provided through at least two tracking cells connected in series to each other in at least one of the at least two columns;
triggering a sense amplifier to access the memory array to perform a memory read operation based on the provided drive current; and
individually coupling each of the at least two columns to or decoupling each of the at least two columns from the sense amplifier using an array controller.

15. A memory device, comprising:
a memory array formed of a plurality of memory cells;
a sense amplifier for accessing the memory array;
means for tracking memory read current of the memory array using one or more columns of tracking cells;
means for connecting a first set of at least two tracking cells in at least one of the columns in series to each other;
means for connecting a second set of at least two tracking cells in the at least one column in series to each other;
means for providing a drive current on corresponding bit lines coupled to the one or more columns of tracking cells based on the tracked memory read current, at least a portion of the drive current being provided through the first set of at least two tracking cells and the second set of at least two tracking cells connected in series to each other in the at least one column;
means for connecting the first set of at east two tracking cells arid the second set of at least two tracking cells in parallel to the corresponding bit line of the at least one column to provide at least the portion of the drive current; and
means for triggering the sense amplifier to access the memory array to perform a memory read operation based on the provided drive current.

16. The memory device of claim 15, wherein at least two of the tracking cells connected in series to each other in at least one of the first set or the second set are coupled to the corresponding bit line of the at least one column through a single, shared connection and provide the drive current less than either tracking cell individually.

17. The memory device of claim 15, wherein the memory device is integrated into in an electronic device that comprises one or more of a set top box, a music player, a video player, an entertainment unit, a navigation device, a communications device, a personal digital assistant (PDA), a fixed location data unit, or a computer.

18. The memory device of claim 15, wherein the memory device is integrated into at least one semiconductor die.

19. A memory device, comprising:
a memory array formed of a plurality of memory cells:
a sense amplifier for accessing the memory array;
means for tracking memory read current of the memory array using at least two columns of tracking cells;
means for connecting at least two tracking cells in at least one of the at least two columns in series to each other;
means for providing a drive current on corresponding bit lines coupled to the at least two columns of tracking cells based on the tracked memory read current, at least a portion of the drive current being provided through the at least two tracking cells connected in series to each other in the at least one column;
means for triggering the sense amplifier to access the memory array to perform a memory read operation based on the provided drive current; and
controller means for individually coupling each of the at least two columns to or decoupling each of the at least two columns from the sense amplifier.

20. A method of reading values stored in a memory array formed of a plurality of memory cells, the method comprising:
step for tracking memory read current of the memory array via a tracking circuit comprising one or more columns of tracking cells;

step for providing a drive current on corresponding bit lines coupled to the one or more columns of tracking cells based on the tracked memory read current, wherein at least a portion of the drive current is provided through a first set of at least two tracking cells connected in series to each other in at least one of the columns and a second set of at least two tracking cells connected in series to each other in the at least one column, the first set and the second set being connected in parallel to the corresponding bit line of the at least one column; and step for triggering a sense amplifier to access the memory array to perform a memory read operation based on the provided drive current.

21. The method of claim 20, wherein the at least two tracking cells connected in series to each other in at least one of the first set or the second set are coupled to the corresponding bit line of the at least one column through a single, shared connection and provide the drive current less than either tracking cell individually.

22. A method of reading values stored in a memory array formed of a plurality of memory cells, the method comprising:

step for tracking memory read current of the memory array via a tracking circuit that comprises at least two columns of tracking cells;

step for providing a drive current on corresponding bit lines coupled to the at least two columns of tracking cells based on the tracked memory read current, at least a portion of the drive current is provided through at least two tracking cells connected in series to each other in at least one of the at least two columns;

step for triggering a sense amplifier to access the memory array to perform a memory read operation based on the provided drive current; and step for individually coupling each of the at least two columns to or decoupling each of the at least two columns from the sense amplifier using an array controller.

23. A computer-readable medium for reading values stored in a memory array formed of a plurality of memory cells, the computer-readable medium encoded with instructions which, when executed by a memory device, cause the memory device to:

track memory read current of the memory array via a tracking circuit comprising one or more columns of tracking cells;

provide a drive current on corresponding bit lines coupled to the one or more columns of tracking cells based on the tracked memory read current, wherein at least a portion of the drive current is provided through a first set of at least two tracking cells connected in series to each other in at least one of the columns and a second set of at least two tracking cells connected in series to each other in the at least one column, the first set and the second set being connected in parallel to the corresponding bit line of the at least one column; and trigger a sense amplifier to access the memory array to perform a memory read operation based on the provided drive current.

24. A computer-readable medium for reading values stored in a memory array formed of a plurality of memory cells, the computer-readable medium encoded with instructions which, when executed by a memory device, cause the memory device to:

track memory read current of the memory array via a tracking circuit that comprises at least two columns of tracking cells;

provide a drive current on corresponding bit lines coupled to the at least two columns of tracking cells based on the tracked memory read current, wherein at least a portion of the drive current is provided through at least two tracking cells connected in series to each other in at least one of the at least two columns;

trigger a sense amplifier to access the memory array to perform a memory read operation based on the provided drive current; and individually couple each of the at least two columns to or decouple each of the at least two columns from the sense amplifier using an array controller.

* * * * *